United States Patent
Diamant et al.

(10) Patent No.: US 10,432,216 B1
(45) Date of Patent: Oct. 1, 2019

(54) CONFIGURABLE COMPRESSION CIRCUIT

(71) Applicant: AMAZON TECHNOLOGIES, INC., Seattle, WA (US)

(72) Inventors: Ron Diamant, Albany, CA (US); Svetlana Kantorovych, Haifa (IL); Ori Weber, Tel-Aviv (IL); Michael Baranchik, Natanya (IL)

(73) Assignee: Amazon Technologies, Inc., Seattle, WA (US)

( * ) Notice: Subject to any disclaimer, the term of this patent is extended or adjusted under 35 U.S.C. 154(b) by 318 days.

(21) Appl. No.: 15/614,161

(22) Filed: Jun. 5, 2017

(51) Int. Cl.
 *H03M 7/30* (2006.01)
 *H03K 19/173* (2006.01)
 *G06F 16/25* (2019.01)

(52) U.S. Cl.
 CPC ........ *H03M 7/3084* (2013.01); *G06F 16/258* (2019.01); *H03K 19/1737* (2013.01); *H03M 7/3059* (2013.01); *H03M 7/6064* (2013.01)

(58) Field of Classification Search
 CPC ........................................ H03M 7/3084–3097
 USPC ...................... 341/51, 67, 87, 106
 See application file for complete search history.

(56) References Cited

U.S. PATENT DOCUMENTS

| | | | | |
|---|---|---|---|---|
| 5,159,336 A | * | 10/1992 | Rabin | G06F 3/0601 341/51 |
| 5,388,247 A | * | 2/1995 | Goodwin | G06F 9/383 711/136 |
| 9,112,525 B1 | * | 8/2015 | Sjoholm | H03M 7/6023 |
| 9,473,168 B1 | * | 10/2016 | Gopal | H03M 7/3086 |
| 10,224,957 B1 | * | 3/2019 | Cassetti | H03M 7/3086 |
| 2019/0123763 A1 | * | 4/2019 | Bissessur | H03M 7/3086 |

FOREIGN PATENT DOCUMENTS

WO WO-9519662 A1 * 7/1995 ............. G06T 9/005

* cited by examiner

*Primary Examiner* — Matthew D Sandifer
(74) *Attorney, Agent, or Firm* — Blank Rome LLP

(57) ABSTRACT

A compression circuit includes a buffer, a selection circuit, a compare circuit, and a control circuit. The buffer stores uncompressed data. The selection circuit generates a read pointer value to the buffer. The control circuit contains a programmable configuration register. The configuration register stores a depth value for reading uncompressed data from the history buffer. The control circuit generates control signals to the selection circuit to cause the selection circuit to iteratively increment the read pointer value from an initial value to a second value that corresponds to the depth value. Responsive to the second value corresponding to the depth value, the control circuit resets the read pointer value to the initial value. The compare circuit compares input symbols from a data source to uncompressed data from the buffer history to thereby generate output compressed data.

19 Claims, 4 Drawing Sheets

CONFIGURABLE COMPRESSION CIRCUIT

BACKGROUND

Many hardware systems comprise storage devices and have internal networks or interfaces to external networks. Data is stored in the storage devices and transmitted across the networks. Some systems compress the data before transmitting it across a network and/or before storing it in a storage device to alleviate bandwidth problems that might otherwise occur if the data was not compressed. Some compression algorithms are "lossy" and other compression algorithms are "lossless." A lossy algorithm encodes data using inexact approximations and discards partial data. In lossy compression, the exact original input data is not recoverable due to removal of information during the compression process and only an approximation of the original input data is recoverable. Lossless compression does not degrade the data—the original input data can be recovered precisely. Lossy compression is often used to compress multimedia data such as audio, video and images in which some degradation is acceptable. Lossless compression often is used to compress text and data files such as bank records and text articles in which loss of information content may be unacceptable.

BRIEF DESCRIPTION OF THE DRAWINGS

For a detailed description of various examples, reference will now be made to the accompanying drawings in which.

DETAILED DESCRIPTION

Figure 1:
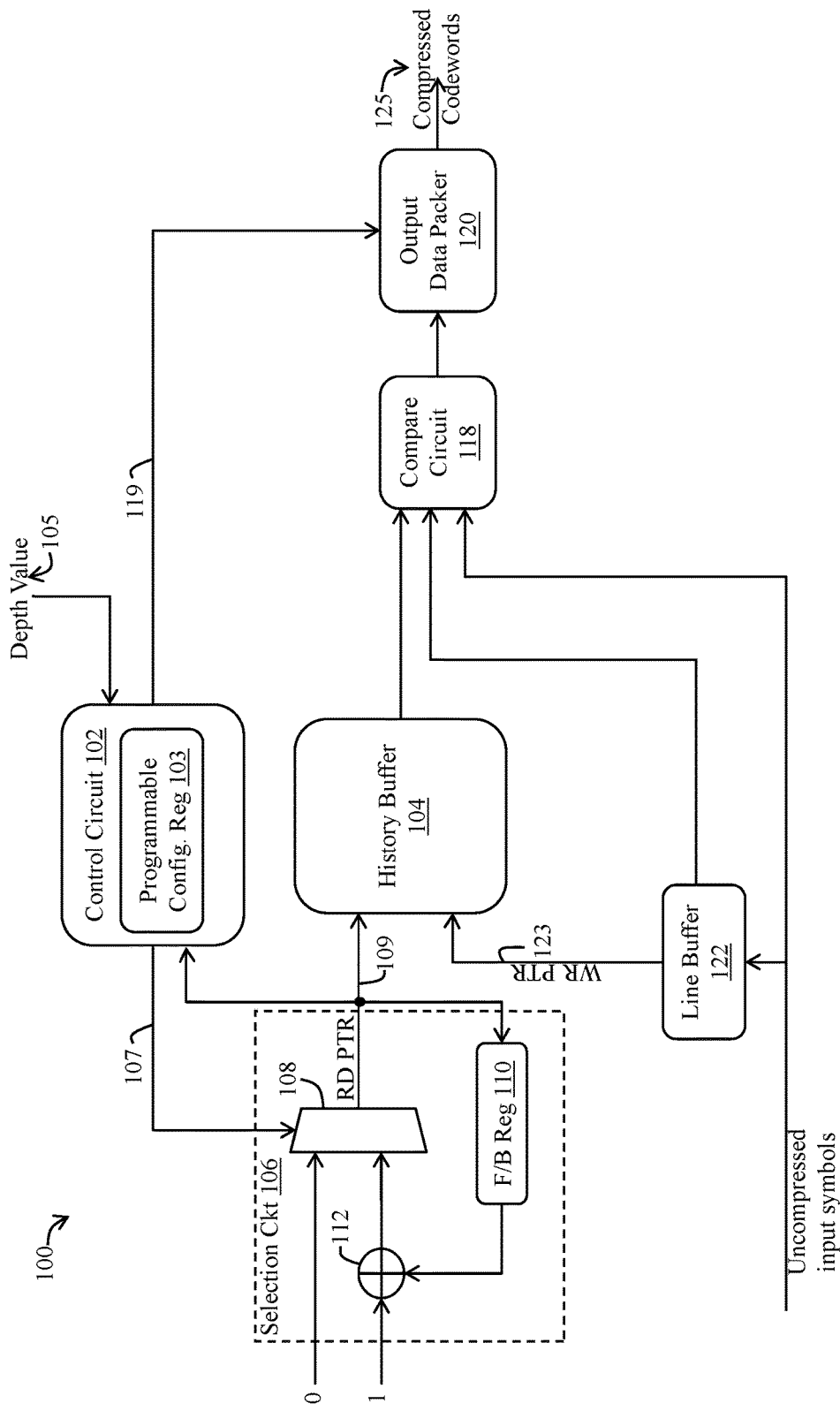
FIG. 1 shows a compression circuit in accordance with various examples.

The disclosed embodiments relate to a compression circuit and in some embodiments to a lossless compression circuit. The compression performed by the compression circuit may employ particular compression algorithm, for example, the Lempel-Ziv (LZ) algorithm and/or any of its numerous variants such as "LZ77," "LZ78," "LZS," "LZSS," "LZ4," "LZO," etc. In general, the compression algorithm implemented by the disclosed compression circuit compares "symbols" from a data source (e.g., an input file) to be compressed to at least some data contained in a history buffer. The history buffer is written with a predetermined amount of data from the data source that immediately precedes the symbols to be compressed. Matches between strings of consecutive data values within the symbols to be compressed and the contents of the history buffer are detected. In some implementations, repeated occurrences of such matching data strings are replaced with references to a single copy of the data existing earlier in the history buffer. A match may be encoded by a length-distance pair of numbers. The length specifies the number of bytes in the matching string and the distance specifies the number of bytes that precede the string back into the history buffer to the matching counterpart string. The distance value also may be referred to as an offset.

Comparing the current symbols to be compressed to the entire history buffer, or even just a large portion of it, has advantages and disadvantages. On one hand, the compression ratio (the size of the uncompressed input relative to the resulting compressed output) generally will advantageously be larger if the entire history is available to detect matching byte strings. On the other hand, reading and using the entire history buffer is time-consuming. For some applications (e.g., hard disk drivers that compress data before storage on the drives), the compression of the input data may not be as time-constrained as for other applications and, instead achieving a higher compression ratio is advantageous. In other cases, compression speed is more important than compression ratio. Examples of this latter class of cases include the HyperText Transport Protocol (HTTP) or HyperText Transport Protocol Secure (HTTPS), which may compress data for transport across a network.

In accordance with the disclosed embodiments, the compression circuit can be configured to use as much or as little of the history buffer as is desired for a given application. For those applications for which compression speed is more important than compression ratio, the compression circuit can be programmed to use less of the history buffer thereby resulting in less data being read from the history during the compression process. As a result, the compression speed of the compression circuit is increased. Other applications, however, may benefit more from a higher compression ratio and less from compression speed, and for such applications, the compression circuit can be programmed to use more all of the history buffer during the compression process.

FIG. 1 shows an example of a compression circuit 100 comprising a control circuit 102, a history buffer 104, a selection circuit 106, a compare circuit 118, an output data packer 120, and a line buffer 122. The control circuit 102 may be implemented as any type of a finite state machine such as a processor that executes machine instructions, a discrete circuit, a programmable logic array, a field programmable gate array, a system-on-ship (SoC), etc. The control circuit 102 includes a configuration register 103 into which a depth value 105 (described below) can be programmed to configure the compression circuit 10 to use a particular amount of the history buffer 104.

The history buffer 104 may be implemented as one or more memory devices (e.g., static random access memory, dynamic random access memory, etc.). The storage capacity of the history buffer 104 is application specific. In one example, the history buffer 104 has a 64 Kbyte capacity, but can have a different capacity in other implementations. In some embodiments, the history buffer 104 is arranged as a plurality of "lines" of storage capacity. Data may be written to and read from the storage buffer 104 in integer multiples of lines. As such, an entire line of data (not a partial line) is written to, or read from, the history buffer 104. In other embodiments, partial line read/write transactions are possible. In one example, to write a partial line in the history buffer 104, a read-modify-write transaction is performed in which an entire line is read, modified to include new data values, and the entire modified line is written back to the history buffer.

In the embodiment of FIG. 1, however, the compression circuit performs complete line reads and writes. The line buffer 122 in the example of FIG. 1 has a capacity that matches the line size of the history buffer 104. For example, if the history buffer 104 is organized as 128 lines with each line having a size of 512 bytes (for a total buffer capacity of 64 Kbytes), the size of the line buffer 122 also is 512 bytes. Once the line buffer 122 is full and thus has an entire line's worth of data to be written to the history buffer 104, the contents of the line buffer is written in full to a line of the history buffer 104 using a write pointer 123.

The selection circuit 106 generates a read pointer 109 to the history buffer 104 to read data from the buffer. The data read from the history buffer 104 is provided to the compare circuit 118. In the example shown in FIG. 1, the selection circuit 106 comprises a multiplexer 108, a feedback register 110, and an adder 112. The read pointer 109 is output from the multiplexer 108 and provided to the history buffer 104 and also stored in the feedback register 110. From the feedback register 110, the value of the read pointer is incremented by the adder 112 (e.g., a value of 1 is added to the read pointer value) and the incremented read pointer is then provided to an input of the multiplexer. Another multiplexer input is configured (e.g., hardwired) for a predetermined initial value (e.g., 0 in the implementation of FIG. 1). The multiplexer 108 is controlled by a control signal 107 generated by the control circuit 102. The control signal 107 from the control circuit 102 causes the multiplexer 108 to select one or the other of its inputs to be provided as the read pointer 109. Thus, the read pointer is selected either to be a value of 0 or an incremented value of the previous value of the read pointer.

The data to be compressed may be an input file (e.g., a text file, an image file, etc.) or input data in a form other than as a file. The input data is referred to as a "data source." The compare circuit 118 detects common byte strings within the data source that are candidates for being replaced as noted above. In some implementations, "symbols" comprising the data source are processed through the compression circuit 100 and compressed. In some cases, a symbol is a byte, but in other cases, a symbol may comprise multiple bytes.

The uncompressed input symbols from the data source are provided to the compare circuit 118 and compared to at least a portion of the history buffer 104. Matching sequences of symbols are detected by the compare circuit 118, and length and distance values are calculated by the compare circuit as explained above. The length and distance values are provided to the output data packer 120, which generates the output compressed codewords 125 in accordance with a particular compression algorithm. For example, for the LZ77 compression algorithm, the format of each symbol of the compressed codewords 125 includes a compression flag followed by either a distance, length tuple or an uncompressed symbol. If the symbol is to be compressed, the compression flag is a logic 1 and the subsequent values is the distance, length tuple. If the symbol is not compressed, the compression flag is a logic 0 and the subsequent value is the uncompressed symbol itself. Other compression algorithms encode the output data in different formats. The output data packer 120 forms the output data in accordance with the format of the implemented compression algorithm. The compression circuit 100 may be capable of implementing multiple different compression algorithms and thus the output data packer 120 is configurable to implement the format requirements of any of the compression algorithms of the compression circuit 100. In some embodiments, the control circuit 102 may be programmed with a value indicative of a particular compression algorithm to use when compressing a data source, and the control circuit 102 may send a value or signal 119 to the output data packer 120 indicative of the particular compression algorithm. The output data packer 120 then formats the data from the compare circuit 118 in accordance with the specified compression algorithm.

In operation, uncompressed input symbols from the source data are provided to the line buffer 122 and to the compare circuit 118. Once the line buffer 122 has enough symbols to fill an entire line of the history buffer 104, the contents of the line buffer are written to the history buffer. For each symbol to be compressed and provided to the compare circuit 118, the history buffer 104 contains uncompressed symbols from the data source that precede the symbol to be compressed. For example, if the data source is a file and the compression circuit begins compressing the file from the beginning of the file, the history buffer 104 is continually updated to include a portion of the file that precedes the symbols being compressed. In one example, the history buffer 104 contains 64 Kbytes of uncompressed symbols that precede the symbol(s) to be compressed. As input symbols are received and compressed, additional symbols are added to the history buffer with the oldest symbols from the history buffer being removed. The history buffer thus is continually updated to include the symbols immediately preceding the symbols being processed by the compare circuit 118. Some of the most recent symbols may be in the line buffer 122 pending their write to the history buffer 104. Thus, the compare circuit 118 receives the input symbols to be compressed and compares them to at least some of the contents of the history buffer 104 and the line buffer 122.

As noted above, the compression circuit 100 can be configured in terms of the amount of the history buffer 104 that is to be used by the compare circuit 118 when compressing the input symbols. A depth value 105, programmable into the configuration register 103 of the control circuit 102, is a value that represents the portion of the history buffer 104 that is to be used to compress each input symbol. In one example, the depth value is a number of memory access cycles. Each memory access cycle results in reading, for example, a line form the history buffer 104. Thus, the depth value may specify the number of lines of data to read from the history buffer. If each line is 512 bytes wide, than a depth value of 1 would mean that only 512 bytes of the history buffer are to be read when compressing each symbol. If the history buffer has a capacity of H (e.g., 64 Kbytes) and a line width of M (e.g., 512 bytes), then a depth value of H/M would result in the control circuit 102 causing the entire history buffer 104 to be read and used to compress each symbol. Depth values in between 1 and H/M cause more than 1 line but less than the entire history buffer to be read. In the example in which H is 64 Kbytes and M is 512 bytes, then the depth value is an integer that can range from 1 to 128. In another implementation, the depth value 105 can be specified as a percentage of the history buffer 104 to use—from 0% to 100%. The percentage can be mapped by the control circuit 102 to a corresponding number of history buffer lines to read when compressing the input symbols.

In some embodiments, an application driver can be used to program the depth value 105 into the control circuit 102. A user of a system containing, or coupled to, the compression circuit 100 executes the application driver. The driver may prompt the user to enter the depth value, or select the depth value from a set of possible choices for the depth value. In other embodiments, the user may include the depth value as part of a request submitted to the system containing the compression circuit 100 to compress a given data source. Being able to specify the depth value affords a user control over the compression algorithm to balance speed versus the compression ratio.

To read the portion of the history buffer 104 corresponding to the depth value 105, the control circuit 102 generates the control signal 107 to select one of the two inputs to the multiplexer 108 to be provided to the history buffer 104 as the read pointer 109. As described above, one input is a 0 and the other input is the read pointer used to read the previous line of the history buffer 104 incremented so as to permit the subsequent line of the history buffer to be read. The control circuit 102 initially causes the read pointer 109 to be 0. The read pointer thus causes the first line of the history buffer to be read. The feedback register 110 stores the read pointer value (0 at this point) and then the adder 112 increments the read pointer from the register 110 and provides the incremented value (1 at this point) as an input to the multiplexer 108. The control signal 107 from the control circuit 102 again is asserted causing the incremented pointer value (1) to be provided as the read pointer 109 to the history buffer 104 to read the next line of the history buffer. The current state of the read pointer also is provided to the control circuit 102 to permit the control circuit to compare the read pointer 102 to the depth value 105 (or to a value derived from the depth value). The read pointer 109 thus is incremented by operation of the selection circuit 106 until the control circuit 102 determines that the number of lines read from the history buffer 104 matches the depth value 105 programmed into the configuration register 103. When the depth value 105 is reached, the control circuit 102 then asserts the control signal 107 to cause the value of 0 to be selected to be the read pointer 109, effectively resetting the read pointer to 0. The process repeats with each input symbol to be compressed. As some of the immediate symbol history may still be in the line buffer 122 (and not yet written to the history buffer 104), the compare circuit 118 may receive some of the symbol history from the history buffer as described above) and other symbol history from the line buffer 122.

Figure 2:
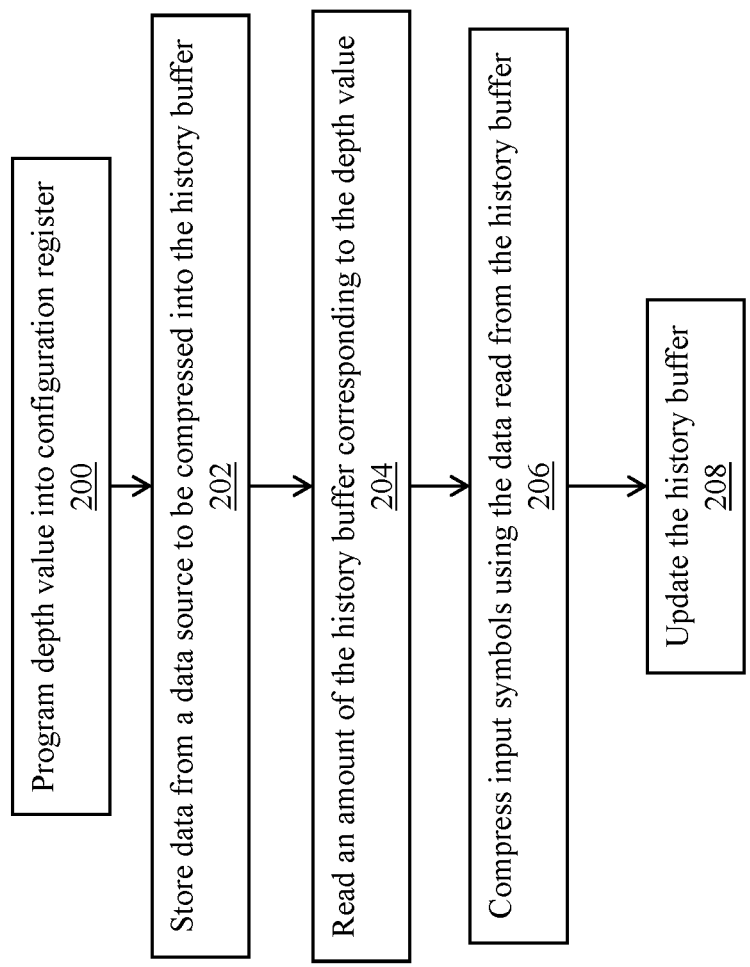
FIG. 2 shows a method for using the compression circuit in accordance with various examples.

FIG. 2 illustrates a method directed to the use and operation of the compression circuit 100. At 200, the method includes programming a depth value 105 into the configuration register 103. Examples of various types of depth value representations are provided above. In one embodiment, the depth value 105 to be programmed into the configuration register 103 may be included within a "descriptor" that includes other information as well to instruct the compression circuit 100 how to compress a given symbol, or set of symbols. The compression instructions for each symbol or set of symbols may be identified by a separate descriptor. In one embodiment, each descriptor includes multiple fields of information including, for example, an address, a length, an identifier of a compression algorithm, the depth value, and first and last status bits. The address specifies the starting address of a block of memory and the length may identify how large the block of memory is. For example, the length may comprise a byte count. The compression algorithm to be used (e.g., LZ77, LS, etc.) may be specified in alphanumeric form, by an index value that is mapped to a specified algorithm, or other ways. The first and last bit fields are used to identify the descriptor for the initial symbol of a data source, the last symbol of a data source or a symbol in between the first and last symbols. For example, a descriptor's first and last bits set to 1 and 0, respectively, may mean that the descriptor is for the first symbol in a data source. First and last bits set to 0 and 1, respectively, may mean that the descriptor is for the last symbol in the data source. When a descriptor neither corresponds to the first nor last symbol of a data source, both the first and last bits may be set to 0.

Upon receiving a descriptor, the control circuit 102 parses the fields of the descriptor to configure the compression circuit 100 to compress the corresponding symbol as specified. This process may include storing the depth value from the descriptor into the configuration register 103. Each subsequent descriptor may also have a depth value that can be used to overwrite the previous depth value in the configuration register 103.

Then, at 202, the method includes storing data from a data source to be compressed in the history buffer 104. The data source may be a file other structure containing data to be compressed. In one embodiment, symbols from the data source are written directly into the history buffer 104. In other embodiments, symbols from the data source are written first into the line buffer 122, and then into the history buffer 104 from the line buffer 122.

At 204, the method includes reading an amount of the history buffer 104 corresponding to the depth value. For example, the depth value may specify a particular number of lines of the history buffer to be read. The amount of the history buffer 104 may be less than the entire history buffer. At 206, the data read from the history buffer 104 is then used to compress the input symbols. The history buffer is then updated at 208 with the input symbols that were just processed for compression. The oldest symbols in the history buffer may be removed as well. The method of FIG. 2 is repeated with each subsequent input symbol to be compressed. The history buffer 104 also may be updated to maintain the most recent of uncompressed symbols relative to the symbols to be compressed.

Figure 3:
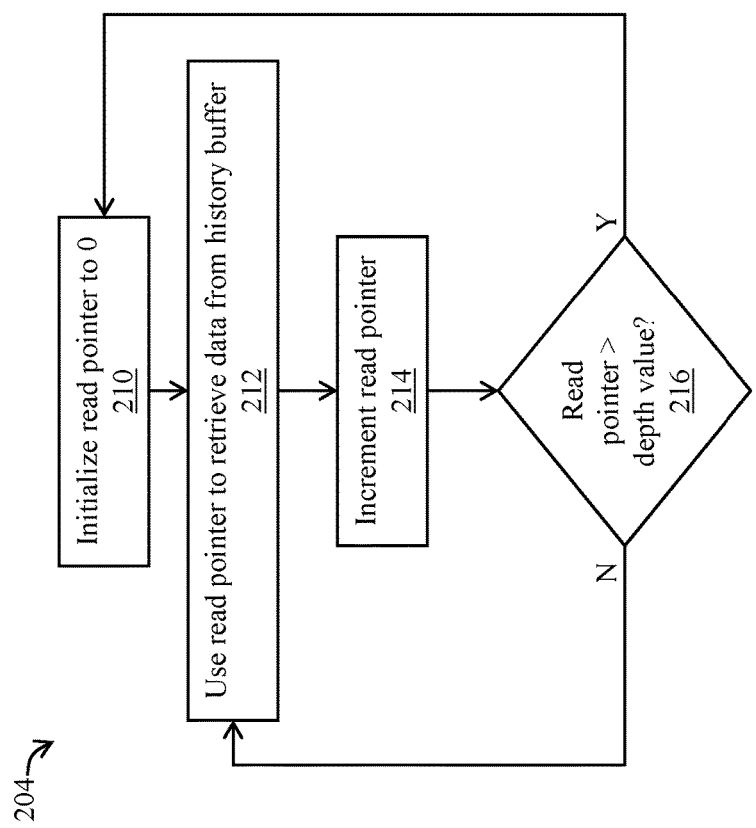
FIG. 3 shows an example of a method for reading data from a history buffer to be used during the compression process.

FIG. 3 shows an example implementation of operation 204 in FIG. 2 in which data is read from the history buffer 104. At 210 in FIG. 3, the method includes initializing the read pointer 109 to a value of 0 (or other suitable initial value). Then, at 212 the method includes using the read pointer to retrieve data from the history buffer 212. The read pointer 109 is then incremented at 214. Incrementing the read pointer may comprise incrementing the read pointer by a value of 1 in some embodiments, or by a value other than 1 in other embodiments.

At 216, the method includes determining whether the read pointer is greater than the depth value programmed into the configuration register 103 in operation 200 in FIG. 2. This determination may be made by the control circuit 102 receiving a copy of the read pointer from the selection circuit 106 or by the control circuit 102 recording the number of times it asserts the control signal 107 after causing the read pointer to reset to 0. If the read pointer is not greater than the depth value, then control loops back to operation 212 and another portion (e.g., another line) is read from the history buffer 104. If, however, the read pointer is greater than the depth value, then control loops back to operation 210 and the read pointer is initialized back to 0, and the process repeats. The greater than operator (>) in operation 216 may comprise the greater than or equal to operator (≥).

Figure 4:
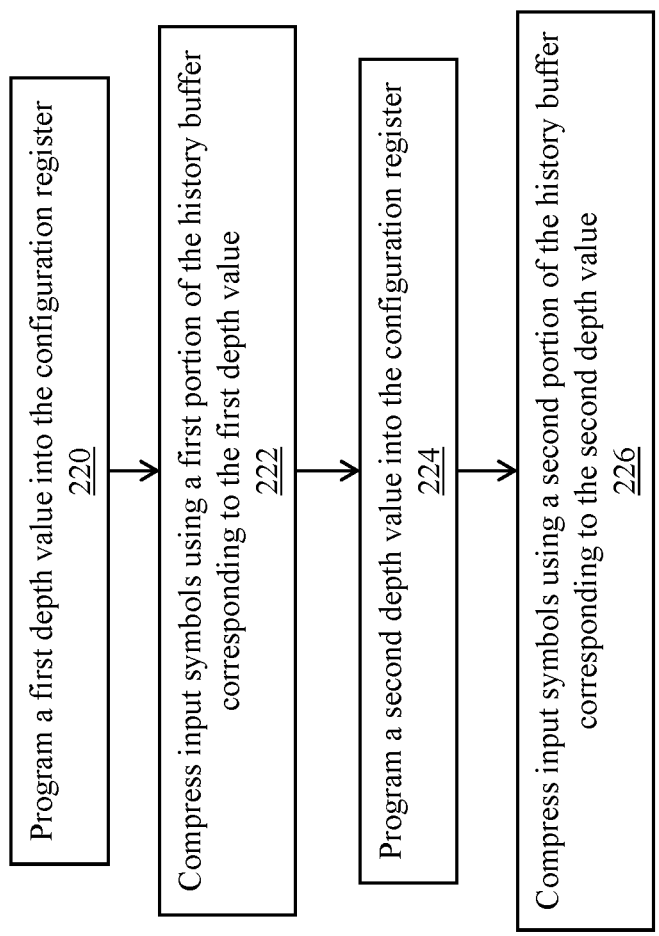
FIG. 4 shows an example of a method in which a depth value usable to read a portion of the history buffer is changed while compressing a data source.

In some examples, an entire data source is compressed using a single depth value 105 programmed into the compression circuit. The depth value 105 may be modified for different data sources as desired. In other embodiments, the depth value 105 may be modified for different portions of a single data source. The depth value 105 may be changed on an individual symbol basis. FIG. 4 shows an example in which at 220, a first depth value is programmed into the configuration register 103. One or more input symbols are then compressed at 222 using a first portion of the history buffer 104 corresponding to the first depth value. A second depth value (different from the first depth value) is then programmed into the configuration register 103 at 224. The second depth value causes input symbols to then be compressed using a second portion of the history 104 corresponding to the second depth value. Thus, different portions of the history buffer 104 can be used to compress different symbols within a common data source (e.g., a file). The depth value 105 can be modified any number of times while compressing a given data source.

To decompress the compressed data, knowledge of the programmable amount of the history buffer 104 used to compress the data source is not needed. That is, the value of the depth value(s) 105 programmed into the compression circuit 100 is not needed during a subsequent decompression operation. This approach may, for example, result in a higher overall compression ratio for the data source compared to using a single depth value for the entire data source.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A compression circuit, comprising:
A history buffer to store uncompressed data;
a multiplexer coupled to the buffer and comprising first and second inputs, wherein the first input is configured to provide an initial value, and wherein the multiplexer is configured to generate a read pointer value to the buffer;
a feedback register coupled to an output of the multiplexer and configured to store the read pointer value;
an adder coupled to the feedback register and the second input of the multiplexer, wherein the adder is configured to increment the read pointer value from the feedback register to thereby generate an incremented read pointer value, and wherein the adder is configured provide the incremented read pointer value to the second input of the multiplexer;
a compare circuit coupled to the history buffer; and
a control circuit containing a programmable configuration register configured to store a depth value, wherein the control circuit is configured to cause the multiplexer to select the initial value as the read pointer and then to iteratively select the incremented read pointer value from the adder until the read pointer value matches the depth value, and then to again select the initial value as the read pointer value;
wherein the compare circuit is configured to compare input symbols to uncompressed data from the history buffer to thereby generate output compressed data.

2. The compression circuit of claim 1, wherein the depth value comprises a value such that less than the entire history buffer is read for comparison to the input symbols to thereby increase compression speed of the compression circuit.

3. The compression circuit of claim 1, further comprising a line buffer, and wherein:
the history buffer is configured to store the uncompressed data in a plurality of lines, each line having a line width;
the line buffer has a capacity equal to the line width of the history buffer;
line buffer is configured to store the input symbols; and
responsive to the line buffer becoming full of input symbols, the line buffer is configured to write its stored input symbols to the history buffer.

4. The compression circuit of claim 1, wherein the initial value is 0.

5. The compression circuit of claim 1, wherein the compare circuit is configured to generate lossless output compressed data.

6. The compression circuit of claim 1, wherein the compare circuit is configured to compare the input symbols to uncompressed data read from the history buffer based on a second depth value stored in the programmable configuration register.

7. A circuit, comprising:
a history buffer to store uncompressed data;
a selection circuit coupled to the history buffer and configured to provide a read pointer value to the history buffer;
a compare circuit coupled to the history buffer; and
a control circuit containing a programmable configuration register, wherein the configuration register is configured to store a depth value for reading uncompressed data from the history buffer and the control circuit is configured to generate control signals for the selection circuit to cause the selection circuit to iteratively increment the read pointer value from an initial value to a second value that corresponds to the depth value and, responsive to the second value corresponding to the depth value, to reset the read pointer value to the initial value;
wherein the compare circuit is configured to compare input symbols from a data source to uncompressed data from the buffer history to thereby generate output compressed data.

8. The circuit of claim 7, wherein the circuit is a system-on-chip (SoC).

9. The circuit of claim 7, wherein the depth value comprises a value such that less than the entire history buffer is read for comparison to the input symbols.

10. The circuit of claim 7, wherein the selection circuit comprises a multiplexer coupled to a feedback register and an adder.

11. The circuit of claim 10, wherein:
the feedback register is configured to store each generated value of the read pointe value;
the adder is configured to increment the read pointer value stored in the feedback register to produce an adder output value; and
the multiplexer inputs include the initial value and the adder output value.

12. The circuit of claim 7, further comprising a line buffer coupled to the history buffer and the compare circuit, and wherein:
the history buffer is configured to store the uncompressed data in a plurality of lines, each line having a line width;
the line buffer has a capacity equal to the line width of the history buffer;
the line buffer is configured to store input symbols, each input symbol having a size smaller than the capacity of the line buffer; and responsive to the line buffer becoming full of input symbols, the line buffer is configured to write its stored input symbols to the history buffer.

13. The circuit of claim 7, wherein the compare circuit is configured to generate lossless output compressed data using the Lempel-Ziv (LZ) compression algorithm.

14. The circuit of claim 7, wherein the control circuit is configured to generate the control signals to thereby cause less than all of the contents from the history buffer to be read from the history buffer for use in comparison to the input symbols for generation of the output compressed data.

15. The compression circuit of claim 7, wherein the compare circuit is configured to:
compare a first set of input symbols from the data source to a first portion of the history buffer read using the depth value to thereby generate the output compressed data; and
then to compare a second set of input symbols from the data source to a second portion of the history buffer, different in size from the first portion, the second portion having been read using a second depth value stored in the programmable configuration register to thereby generate additional output compressed data.

16. A method, comprising:
storing a programmable depth value into a configuration register;
storing data from a data source into a history buffer;
reading a portion of the history buffer based on the depth value; and
compressing data from the data source using the portion of the history buffer;
wherein reading the portion of the history buffer includes:
initializing a read pointer to an initial value;
retrieving data from the history buffer using the read pointer;
incrementing the read pointer to produce an incremented read pointer; and
responsive to the incremented read pointer corresponding to the depth value, re-initializing the read pointer to the initial value and retrieving additional data from the history buffer.

17. The method of claim 16, further comprising, after compressing a portion of the data source:
storing a second programmable depth value into the configuration register;
determining that the incremented read pointer corresponds to the second programmable depth value;
responsive to the determination that the incremented read pointer corresponds to the second programmable depth value, re-initializing the read pointer to the initial value; and
compressing additional data from the data source using a second portion of the history read based on the second programmable depth value.

18. The method of claim 16, wherein reading a portion of the history buffer based on the depth value comprises reading less than all of the contents of the history buffer.

19. The method of claim 16, further comprising receiving the programmable depth value from a user.

* * * * *